United States Patent [19]

Kumagai et al.

[11] Patent Number: 4,992,399

[45] Date of Patent: Feb. 12, 1991

[54] CERAMIC, CIRCUIT SUBSTRATE AND ELECTRONIC CIRCUIT SUBSTRATE BY USE THEREOF AND PROCESS FOR PRODUCING CERAMIC

[75] Inventors: Motoo Kumagai, Yokohama; Keiichi Kato, Tokyo; Masato Nagano; Michiaki Sakaguchi, both of Iwamisawa, all of Japan

[73] Assignees: Canon Kabushiki Kaisha; Nippon Oil & Fats Co., Ltd., both of Tokyo, Japan

[21] Appl. No.: 209,571

[22] Filed: Jun. 21, 1988

[30] Foreign Application Priority Data

Jun. 23, 1987 [JP] Japan .................. 62-156141

[51] Int. Cl.$^5$ .................. H05K 1/03; C04B 35/46; B32B 3/00
[52] U.S. Cl. .................. 174/258; 501/134; 501/135; 501/136; 428/138; 428/209; 428/210; 428/212; 428/426; 428/432; 428/697; 428/901; 252/623 BT
[58] Field of Search .............. 428/138, 209, 210, 212, 428/426, 432, 697, 901; 501/134, 135, 136; 252/62.3 BT; 174/68.5, 258; 361/401

[56] References Cited

U.S. PATENT DOCUMENTS

| 2,648,804 | 8/1953 | Steigerwalt et al. | 361/402 |
| 4,610,969 | 9/1986 | Wada et al. | 501/137 |
| 4,610,970 | 9/1986 | Wada et al. | 501/137 |
| 4,654,750 | 3/1987 | Kumagai | 361/321 |
| 4,759,965 | 7/1988 | Kato et al. | 428/138 |

FOREIGN PATENT DOCUMENTS

| 0157276 | 10/1985 | European Pat. Off. | 501/136 |
| 60-088401 | 5/1985 | Japan | 501/136 |
| 60-107803 | 6/1985 | Japan | 501/136 |
| 60-107804 | 6/1985 | Japan | 501/136 |

*Primary Examiner*—William R. Dixon, Jr.
*Assistant Examiner*—Anthony J. Green
*Attorney, Agent, or Firm*—Fitzpatrick, Cella, Harper & Scinto

[57] ABSTRACT

The present invention provides a ceramic having a first region comprising a dielectric porcelain having an insulating layer at the crystal grain boundary of a semiconductor porcelain containing 0.50 to 5.30 mol parts of $MnO_2$ and 0.02 to 0.40 mol parts of $Y_2O_3$ per 100 mol parts of the principal components comprising 49.50 to 54.00 mol % of $TiO_2$ and 50.50 to 46.00 mol % of SrO, and a second region comprising a dielectric porcelain containing further 0.40 to 5.00 mol parts of $Al_2O_3$ and 0.05 to 2.00 mol parts of $SiO_2$ per 100 mol parts of the principal components in addition to the composition of the first region, and also provides a circuit substrate and an electronic circuit substrate using the same ceramic.

6 Claims, 7 Drawing Sheets

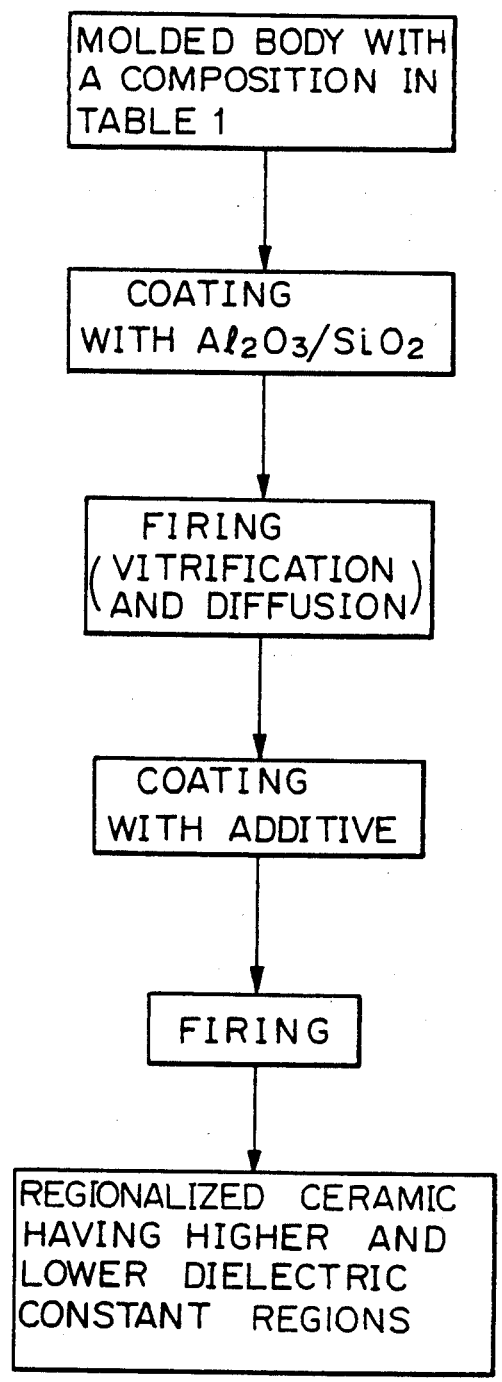

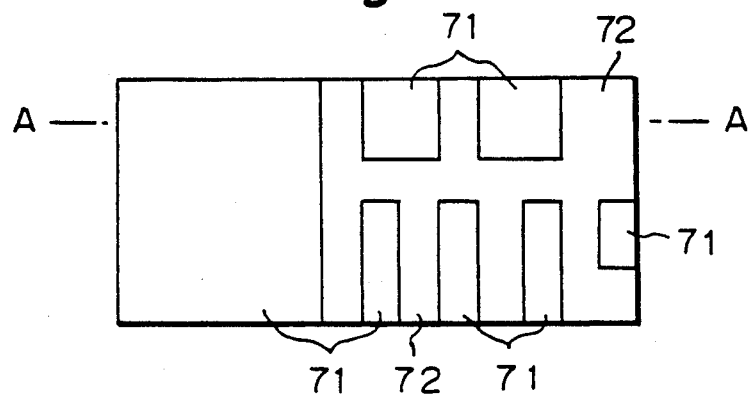
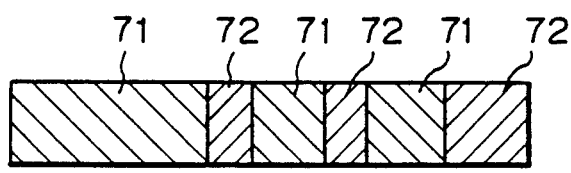
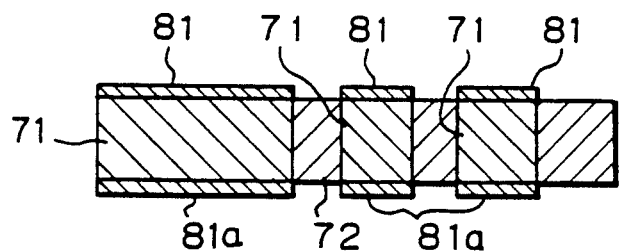
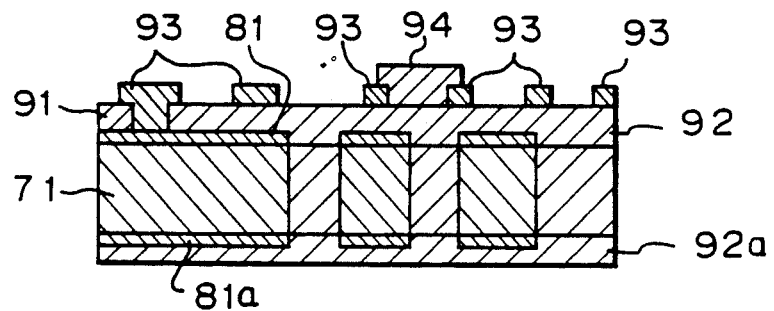

CERAMIC, CIRCUIT SUBSTRATE AND ELECTRONIC CIRCUIT SUBSTRATE BY USE THEREOF AND PROCESS FOR PRODUCING CERAMIC

BACKGROUND OF THE INVENTION

1. Field of the Invention

This invention relates to a ceramic which can be utilized as the electronic material such as dielectric porcelain substrate, etc. and a circuit substrate and an electronic circuit substrate by use of the ceramic, and also a process for producing the ceramic.

2. Related Background Art

In the prior art, an electronic circuit substrate has been constituted by providing only a conductor circuit, a conductor circuit and a resistance, or a conductor circuit, a resistance and a capacitor within the limited range, and other functional portions mounted as the device as separated from the substrate.

More specifically, for example, as a porcelain substrate of the prior art, a substrate primarily having a conductor and a resistor built therein was used, and a capacitor was mounted by soldering thereon as a chip member, etc. For this reason, miniaturization of electronic circuit has been limited. FIG. 1 shows an example thereof, in which 111 is a porcelain substrate, 112 a conductor circuit, 113 a resistor and 114 a chip capacitor.

In recent years, attempts have been made to have a plurality of capacitors built in within a substrate by varying the dielectric constants within the same porcelain substrate.

However, in the prior art, it has been very difficult to practice a method for forming different dielectric portions within the same substrate. For example, as is self-explanatory when considering cumbersomeness in preparing a laminated ceramic capacitor, a substrate having a plurality of capacitors built therein has not yet been realized or practically applied under the present situation. It has also been a technical task to make portions with high dielectric constants sufficiently separated as the device functional portions to the extent that no influence may be exerted on each other in actuation within the limited structural space.

Further, such problem of building in separately the functional portions concerned with electronic parts or circuit substrates are not limited to dielectric porcelains, but has revealed itself generally in the case of forming two or more of the same kind or different kinds of functional portions within the ceramic.

SUMMARY OF THE INVENTION

A first object of the present invention is to provide a ceramic capable of building therein a plurality of functional portions sectionalized as sufficiently separated from each other.

A second object of the present invention is to provide a circuit substrate and an electronic circuit substrate capable of building therein a plurality of electronic part constituent units as sufficiently separated from each other as the device functional parts, by being constituted of a ceramic capable of building therein a plurality of functional portions sectionalized as sufficiently separated from each other as mentioned above.

The above first object can be accomplished by a ceramic, having a first region comprising a dielectric porcelain having an insulating layer at the crystal grain boundary of a semiconductor porcelain containing 0.50 to 5.30 mol parts of $MnO_2$ and 0.002 to 0.40 mol parts of $Y_2O_3$ per 100 mol parts of the principal components comprising 49.50 to 54.00 mol % of $TiO_2$ and 50.50 to 46.00 mol % of SrO, and a second region comprising a dielectric material porcelain containing further 0.40 to 5.00 mol parts $Al_2O_3$ and 0.05 to 2.00 mol parts of $SiO_2$ in addition to the composition of said first region.

The above first object can also be accomplished by a process for producing a ceramic comprising the steps: feeding a mixture and/or a compound comprising 60 to 98 mol % of $Al_2O_3$ and 40 to 20 mol % of $SiO_2$ onto the surface of a molded product containing 0.05 to 5.30 mol parts of $MnO_2$ and 0.02 to 0.40 mol parts of $Y_2O_3$ per 100 mol parts of the main components comprising 49.50 to 54.00 mol % of $TiO_2$ and 50.50 to 46.00 mol % of SrO, and diffusing said compound into the inner portion of said molded product.

The above second object can be accomplished by a circuit substrate having electrodes internally of or on the surface of a ceramic having a first region comprising a dielectric porcelain having an insulating layer at the crystal grain boundary of a semiconductor porcelain containing 0.50 to 5.30 mol parts of $MnO_2$ and 0.02 to 0.40 mol parts of $Y_2O_3$ per 100 mol parts of principal components comprising 49.50 to 54.00 mol % of $TiO_2$ and 50.50 to 46.00 mol % of SrO, and a second region comprising a dielectric porcelain containing further 0.40 to 5.00 mol parts of $Al_2O_3$ and 0.05 to 2.00 mol parts of $SiO_2$ in addition to the composition of said first region, and an electronic circuit substrate having electrodes internally of or on the surface of a ceramic having a first region comprising a dielectric porcelain having an insulating layer at the crystal grain boundary of a semiconductor porcelain containing 0.05 to 5.30 mol parts of $MnO_2$ and 0.02 to 0.40 mol parts of $Y_2O_3$ per 100 mol parts of principal components comprising 49.50 to 54.00 mol % of $TiO_2$ and 50.50 to 46.00 mol % of SrO, and a second region comprising a dielectric porcelain containing further 0.40 to 5.00 mol parts of $Al_2O_3$ and 0.05 to 2.00 mol parts of $SiO_2$ in addition to the composition of said first region, and having an electronic circuit part mounted on said ceramic.

BRIEF DESCRIPTION OF THE DRAWINGS

FIG. 7 is a diagram for illustration of the steps for preparation of the ceramic.

FIG. 8A is a plan view showing the constitutional example of the ceramic of the present invention, and FIG. 8B is a cross-sectional view along A—A in FIG. 8A.

FIG. 9 and FIG. 10 are each schematic sectional view showing a constitutional example of the circuit substrate of the present invention.

DETAILED DESCRIPTION OF THE INVENTION

When the ceramic of the present invention is utilized as, for example, electronic material ceramic, the above functional portion capable of being built in within the ceramic of the present invention may include, for example, electronic part constituting units such as dielectric material constituting condensor, conductor, semiconductor, resistor, insulator, diode, transistor, etc. In the present invention, these functional portions can be formed in the above first region or the second region, and also can be formed in a combination of these regions, a combination of these regions with other regions than these, or even in a region other than these regions.

Also, for example, by arranging two or more of the above first regions separated from each other with the above second region interposed therebetween, or contrariwise by arranging two or more of the above second regions separated from each other with the above first region interposed therebetween, two or more functional regions constituted of the above first region or the second region can be formed as separated sufficiently from each other. Also, both of the first region and the second region can be used as functional portions.

The second region according to the present invention can be utilized as a region with different characteristics by selecting freely the respective amounts of $Al_2O_3$ and $SiO_2$ used and the ratio of these, and can be utilized as various functional portions or regions for dividing the functional portion as desired. Accordingly, by forming one or more of the portion where $Al_2O_3$ and $SiO_2$ exist within the ceramic, a desired number of the functional portions of one or two or more can be sectionalized as sufficiently separated from each other.

When the ceramic of the present invention is utilized as, for example, electronic material ceramic, preferably the functional portion of the first region can be exemplified by electronic part constituting units such as semiconductor, dielectric member for constituting capacitor, conductor, resistor, insulator, diode, transistor, etc. On the other hand, as the second region when the functional portion of the first region is divided, it may preferably include, for example, an insulator relative to semiconductor, conductor, resistor, a lower dielectric relative to higher dielectric for constituting a capacitor.

For example, when a region of dielectric constituting a capacitor as the functional portion is formed, the region in which $Al_2O_3$ and $SiO_2$ exist by diffusion, etc. according to the present invention can be utilized as the region for separating the region of the dielectric constituting the above capacitor.

Figure 1:
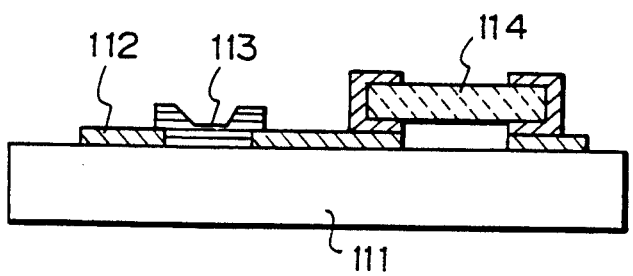
FIG. 1 is a schematic sectional view of the porcelain substrate of the prior art.
Figure 2:
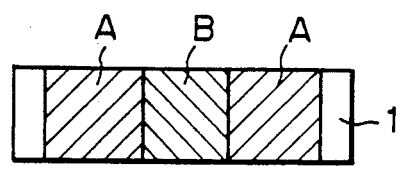
FIG. 2 through FIG. 4 are schematic sectional views showing the shape examples of the first region and the second region of in the ceramic of the present invention, respectively.
Figure 3:
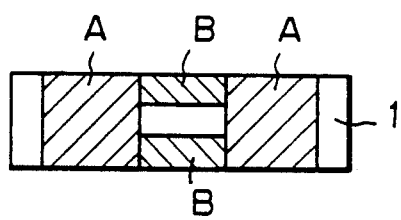
Figure 4:
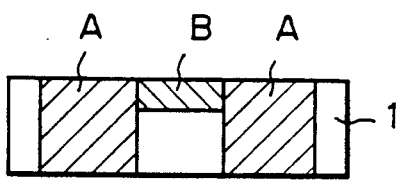

As an example of the ceramic of the present invention, for the plate-shaped dielectric porcelain substrate, shape examples of the region of the dielectric constituting the above capacitor (the first region) and the region with low dielectric constant formed by use of the portion where $Al_2O_3$ and $SiO_2$ exist by diffusion, etc. (the second region) are shown in FIGS. 2 to 4. In the examples shown in FIGS. 2 to 4, 1 is a plate-shaped dielectric material porcelain substrate, A the first region and B the second region.

In FIG. 2, the second region B with a rectangular cross-section reaching the both main surfaces of the plate-shaped dielectric porcelain substrate are provided, and the two first regions A, A separated from each other are provided with the region B sandwiched therebetween.

In the example shown in FIG. 3, the two regions B, B with rectangular cross-sections are provided on the respective surface layers of the both main surfaces of the porcelain 1, and the two first regions A, A separated from each other are provided with these regions B, B sandwiched therebetween.

In the example shown in FIG. 4, the second region B with a rectangular cross-section is provided on the surface layer portion of one main surface of the porcelain 1, and the two first regions separated from each other A, A are provided with the region B sandwiched therebetween.

In the examples shown in FIG. 2 to FIG. 4, one or two of the second region B are provided, but that is not limitative of the present invention, but the number can be determined depending on the desired number of the functional portions (first regions), and 3 or more regions can be also provided, as a matter of course.

When the above first region is made the region of the dielectric for constituting a capacitor, the first dielectric porcelain is required to have high dielectric constant, and it is also desirable in combination with this requirement that the characteristics when constituting the dielectric material itself or a capacitor such as dielectric loss, temperature change rate of capacitance, etc. should be practically preferable.

In this case, the dielectric constant of the first dielectric porcelain should be preferably 35,000 or higher. With such dielectric constant, even when the condition in shape of the ceramic may be taken into account, a capacitor with a capacitance to the extent of about 0.047 uF can be formed, and when applied to, for example, a video circuit, etc., about half of the kinds of ceramic chip capacitors generally employed can be formed within the ceramic.

When the first region is thus utilized as the higher dielectric region, the first dielectric porcelain should be preferably made to have a dielectric constant of 10-fold or more of that of the second dielectric porcelain. This is a performance demanded for removing the influence mutually between the functional portions, and creation of a difference in dielectric constant of 10-fold or more will be very advantageous in miniaturization of the circuit.

When the above first region is made a higher dielectric material region, as the porcelain constituting the first region, a composition having firstly high dielectric constant, and having secondly good performances such as tan δ, temperature characteristics, etc. is preferred. As the material satisfying these requirements, semiconductor porcelains having insulated crystal grain boundaries have been known.

As the additive for insulating the crystal grain boundary, there can be used any conventionally known additive for forming an insulating layer at the crystal grain boundary of semiconductor porcelain. For example, there can be used oxides of iron, cobalt, bismuth, vanadium, chromium, lead, copper, etc., and particularly as preferably used in the present invention, bismuth oxide and sodium oxide.

In recent years, as the semiconductor porcelain of this kind, those containing strontium titanate as the main component have been frequently used.

Here, the semiconductor porcelain comprising 0.5 to 5.3 mol parts of $MnO_2$ and 0.02 to 0.40 mol parts of $Y_2O_3$ added to 100 mol parts of the main components comprising 49.50 to 54.00 mol % of $TiO_2$ and 50.50 to 46.00 mol % of Sro with its crystal grain boundary being insulated with $Bi_2O_3$, etc. has good dielectric characteristics as:

(1) dielectric constant=35000–14000;
(2) $tan\delta \leq 2\%$;
(3) the temperature change of dielectric constant within ±15% in the temperature range of −25° C. to +85° C.

In the semiconductor porcelain, $TiO_2$ and SrO which are the main components in the semiconductor porcelain can exist in the composition as composite oxides such as solid solution, sole oxides respectively of $TiO_2$ and SrO, or a mixture of these. The quantitative ratio of $TiO_2$ to SrO in the composition is made 49.50 to 54.00 mol % for $TiO_2$ and 50.50 to 46.00 mol % for SrO, because if the amount of $TiO_2$ becomes too much, namely the amount of SrO is too small, the desired dielectric porcelain is lowered in dielectric constant, the temperature change of dielectric loss and dielectric constant become greater and yet the insulating resistance of the porcelain is reduced. If the amount of $TiO_2$ becomes smaller, namely the amount of SrO becomes larger, the dielectric constant of the desired dielectric material porcelain is lowered and the temperature change of the dielectric constant becomes larger. The quantitative ratio of $TiO_2$ to SrO in the composition of the present invention is determined for exhibiting optimally the desired characteristics such as these dielectric constant, dielectric loss, temperature change of dielectric constant, insulating resistance of porcelain, ability to be converted to semiconductor, etc. with good balance.

In the ceramic of the present invention, $MnO_2$ plays a role as the sintering aid for forming a porcelain, and its amount used is limited to 0.50 mol parts or more per 100 mol parts of the above main components comprising $TiO_2$ and SrO, because if $MnO_2$ is less than 0.50 mol parts, the dielectric constant of the desired dielectric porcelain is lowered and also the temperature change of the dielectric constant becomes greater. The amount was limited to 5.3 mol parts or lower per 100 mol parts of the above main components comprising $TiO_2$ SrO, because if $MnO_2$ exceeds 5.3 mol parts, the dielectric loss will be increased remarkably.

Next, in the ceramic of the present invention, $Y_2O_3$ has the effect of converting the porcelain into a semiconductor, and its amount used is limited to 0.02 mol parts or more per 100 mol parts of the above main components comprising $TiO_2$ and SrO, because if $Y_2O_3$ is less than 0.02 mol parts, the dielectric constant is lowered. The amount is limited to 0.4 mol parts or less per 100 mol parts of the above main components of $TiO_2$ and SrO, because if $Y_2O_3$ exceeds 0.4 mol parts, the dielectric constant is lowered and the dielectric loss becomes greater.

One specific feature of the present invention resides in making the second dielectric porcelain constituting the second region a porcelain with different dielectric constant from the first region through existence of $Al_2O_3$ and $SiO_2$.

For permitting the first and the second dielectric material porcelains to exist in a ceramic as an integrated structure, they are required to have reactivity at the boundary therebetween, and also it is contrariwise desirable that the reactivity should not be too great so that no deformation may occur at the bonded portion, the strength distribution may not be greatly changed, and the stress may not be included.

The present invention utilizes the property that the electrical characteristics of the porcelain can be changed greatly by the presence of $Al_2O_3$ and $SiO_2$, whereby it has been rendered possible to separate the functional portions within a ceramic. For example, as described in detail in Reference examples shown below, when the amount of $Al_2O_3$ and $SiO_2$ added is changed minutely, it was confirmed that the dielectric constant was remarkably changed between the orders of some hundreds and some ten thousands. Accordingly, without changing the compositions of the porcelains to great extent, they can be built within the same ceramic by sectionalizing areas with different dielectric constants.

An example of the method for preparing the ceramic of the present invention is described below. Here, the porcelain forming composition for constituting the semiconductor porcelain of the above first region is called $C_1$ and the porcelain forming composition for constituting the above second region is called $C_2$.

Figure 5:
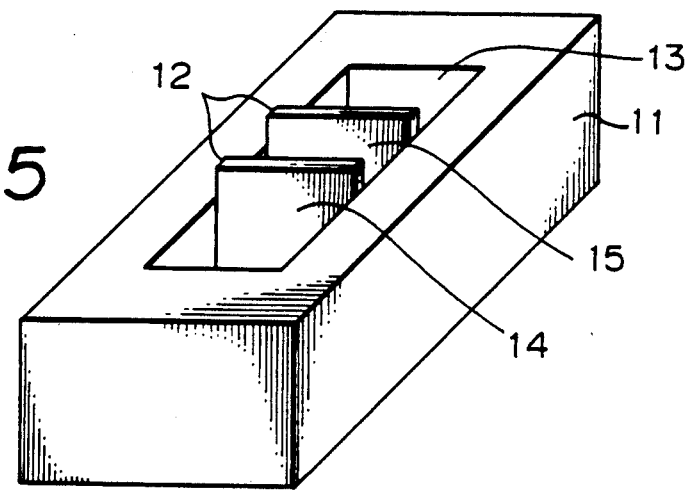
FIG. 5 is a schematic perspective view of a mold for preparing the ceramic of the present invention.

This preparation example can be conducted by the use of a mold as shown in FIG. 5.

More specifically, a detachable partitioning plate 12 is provided on a mold 11 as shown in FIG. 5, $C_1$ is filled in 13, 14, and $C_2$ in 15, followed by removal of the partitioning plate. Then, pressure molding is performed. Here, the both end portions are filled with composition $C_1$ and the central portion is filled with composition $C_2$. In FIG. 6B, for example, a was made equal to 3 mm, b=2 mm, c=3 mm, d=10 mm and e(thickness)=0.55 mm. The molded product is primarily fired to form a semiconductor, and subsequently coated with an additive which becomes the diffused component on the surface of the semiconductor porcelain thus obtained, followed by secondary firing to form an insulating layer at the crystal grain boundary of the semiconductor porcelains, thus forming a dielectric porcelain.

One shape example of the ceramic of the present invention is shown in FIG. 8A (plan view), FIG. 8B (A—A cross-sectional view in FIG. 8A).

The ceramic shown in FIGS. 8A and 8B has a plurality of regions with higher dielectric constant 71, 71, 71 . . . . formed as sectionalized from each other internally of the plate-shaped dielectric porcelain 1, and these regions are mutually separated with the regions with lower dielectric constant 72, 72, 72 . . . . .

Next, the circuit substrate of the present invention is characterized by having at least electrodes internally of or on the surface of the ceramic of the present invention, and having, if desired, at least one functional portion of conductor, resistor and insulator, etc.

As a constitution example of the circuit substrate, when the same elements are represented by the same symbols, the circuit substrate shown in FIG. 9 has a pair of electrode groups 81, 81a, 81, 81a, 81 81a, constituted of thick film electroconductive paste such as silver paste, etc. on both main surfaces of the respective regions with high dielectric constant on the ceramic shown in FIGS. 8A and 8B.

The example of circuit substrate shown in FIG. 10 is further provided with the insulating layers 92, 92a with via hole portion 91 remained optionally by screen printing of an insulating material paste such as glass, etc., a conductor circuit portion 93 printed within the via hole 91 and the insulating layer, and a resistor portion 94.

Further, the electronic circuit substrate of the present invention is characterized by having electrodes internally of or on the surface of the ceramic of the present invention, and having at least one functional portion of conductor, resistor and insulator, etc. existed and an electronic circuit part mounted on the ceramic, if necessary.

Figure 11:
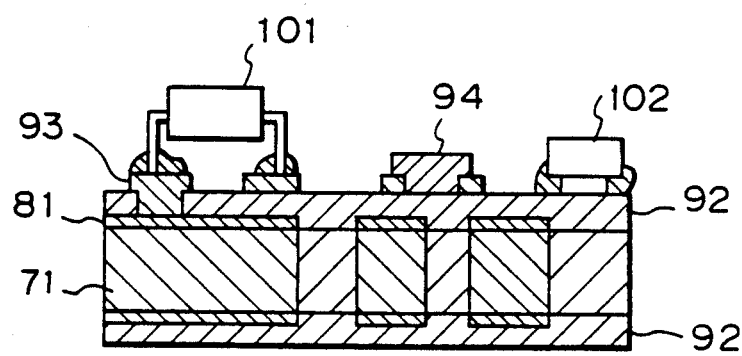
FIG. 11 is a schematic sectional view showing a constitutional example of the electronic circuit substrate of the present invention.

When the same element is represented by the same symbol, for example, the electronic circuit substrate shown in FIG. 11 has a flat package IC 101 and a chip member 102 connected to the conductor circuit portion 93 mounted thereon.

In the following, the present invention is described in more detail by referring to Reference examples and Examples.

The respective starting materials of $TiO_2$, SrO, $MnO_2$ and $Y_2O_3$ were weighed so that the semiconductor porcelain with the compositional ratios shown in Table 1 could be obtained, and pulverized and mixed in a wet system ball mill for 12 hours. The mixture after drying was added with a small amount of polyvinyl alcohol as the binder, granulated into 24 to 80 mesh and molded into discs of 20 mm in diameter and 0.7 mm in thickness by hydraulic pressing. Next, the molded discs were calcined in the air at 950° C. to burn the binder. The product was cooled to room temperature and fired in a reducing atmosphere comprising 10 vol. % of hydrogen and 90 vol. % of nitrogen at 1400° C. for 4 hours.

The semiconductor porcelain thus obtained was soaked into a suspension comprising a weight ratio of ethyl alcohol:$Bi_2O_3$ or $Na_2O$ = 10:1, and then fired in an oxidizing atmosphere at 1250° C. or 0.5 hours to form an insulating layer at the crystal grain boundary.

The discs of dielectric porcelains thus obtained (Sample Nos. 1-25) were coated on both surfaces with silver paste, baked at 850° C. for 30 minutes to form electrodes to prepare capacitors.

The dielectric constant ($\epsilon$), the dielectric loss (tan δ), the insulating resistance (IR) and the temperature characteristic of dielectric constant (temperature changes at −25° C. and +85° C. with 25° C. as the standard) of the dielectric porcelain constituting the capacitor thus obtained were measured to obtain the results shown in Table 1. The measurement conditions were 25° C. and a frequency of 1 kHz. The symbol * in Table 1 is a sample outside the scope of the present invention.

When $Al_2O_3$ is added to the high dielectric constant composition (hereinafter called $C_1$), the porcelain crystal grain size is reduced and the volume resistivity of the semiconductor porcelain increased with increase of the amount of $Al_2O_3$ added, with the result that the dielectric constant is markedly lowered upon being made into a dielectric porcelaim.

In the present invention, $SiO_2$ added together with $Al_2O_3$ has particularly the effect of improving the mechanical strength of the second region and the mechanical strength of the bonded interface between the first region and the second region.

The effects of the addition of $Al_2O_3$ and the addition of $Al_2O_3$ and $SiO_2$ are exemplified in Table 2.

In $C_1$, when the amount of $Al_2O_3$ added is less than 0.40 mol parts per 100 mol parts of the main components (TiO 49.50 to 54.00 mol % and SnO 50.50 to 46.00 mol %), the ratio of the dielectric constant lowered is small, and the dielectric constant will be lowered to below 500 with addition of about 1.5 mol parts. Further, when the amount added is increased, the dielectric constant is reduced but its tendency is dull, and sinterability will be lowered at the point exceeding 5 mol parts, whereby mechanical strength (as represented by flexural strength) will be undesirably lowered.

Accordingly, during addition of $Al_2O_3$, the amount necessary for obtaining the desired dielectric constant at 5 mol parts or less can be determined by experiments, but addition of 0.40 to 5.00 mol parts is required when the ratio $\epsilon_1/\epsilon_2$ of the dielectric constant of the first region $\epsilon_1$ to the dielectric constant of the second region $\epsilon_2$ is designed to be 10 or more.

As is apparent from Table 2, it can be understood that the dielectric constant is changed extremely greatly by varying the amount of $Al_2O_3$ added.

Also from Table 2, it can be understood that the mechanical strength of the second region can be improved by making the amount of $SiO_2$ added 0.05 to 2.00 mol parts per 100 mol parts of the main components of $C_1$.

The further addition effect of $Al_2O_3$ and $SiO_2$ are exemplified in Table 3.

In order to obtain a ceramic shown in FIG. 12, a partitioning plate was placed vertically at the center within the mold, and the respective voids separated with the partitioning plate were filled with predetermined compositional powders shown in Table 3 and press molded, followed by preparation of dielectric porcelains according to the steps as described below.

The starting materials of the respective samples shown in Table 1 were weighed and pulverized and mixed in a wet system ball mill for 12 hours. After the mixture was dried, a small amount of polyvinyl alcohol was added as the binder and the mixture was granulated into 24 to 80 mesh and molded into discs of 20 mm in diameter and 0.7 mm in thickness by means of a hydraulic press. Subsequently, the molded discs were calcined in air at 950° C. for 1 hour to burn the binder. The calcined product was cooled to room temperature and then fired in a reducing atmosphere comprising 10 vol. % of hydrogen and 90 vol. % of nitrogen at 1400° C. for 4 hours.

The semiconductor porcelain thus obtained was soaked into a suspension comprising a weight ratio of ethyl alcohol:$Bi_2O_3$ or $Na_2O$ = 10:1 and then fired in an oxidizing atmosphere at 1250° C. for 0.5 hours to form an insulating layer at the crystal grain boundary.

Figure 12:
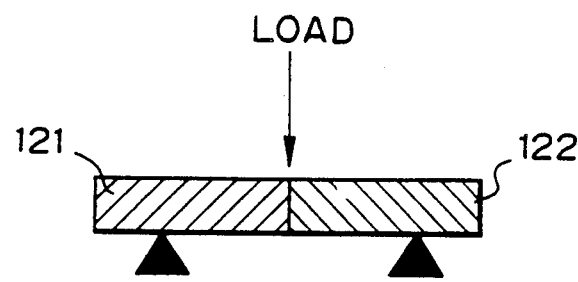
FIG. 12 is a schematic sectional view showing the method for measuring the flexural strength of the ceramic molded product.

The flexural strength of the ceramic bonded product thus obtained was measured by use of the method shown in FIG. 12. The results are shown in Table 3.

When the amount of $SiO_2$ added based on 100 mol parts of the main components of $C_1$ is less than 0.05 mol parts or over 2 mol parts, no improved effect of mechanical strength at the bonded interface with the first region can be recognized as shown.

Figure 13:
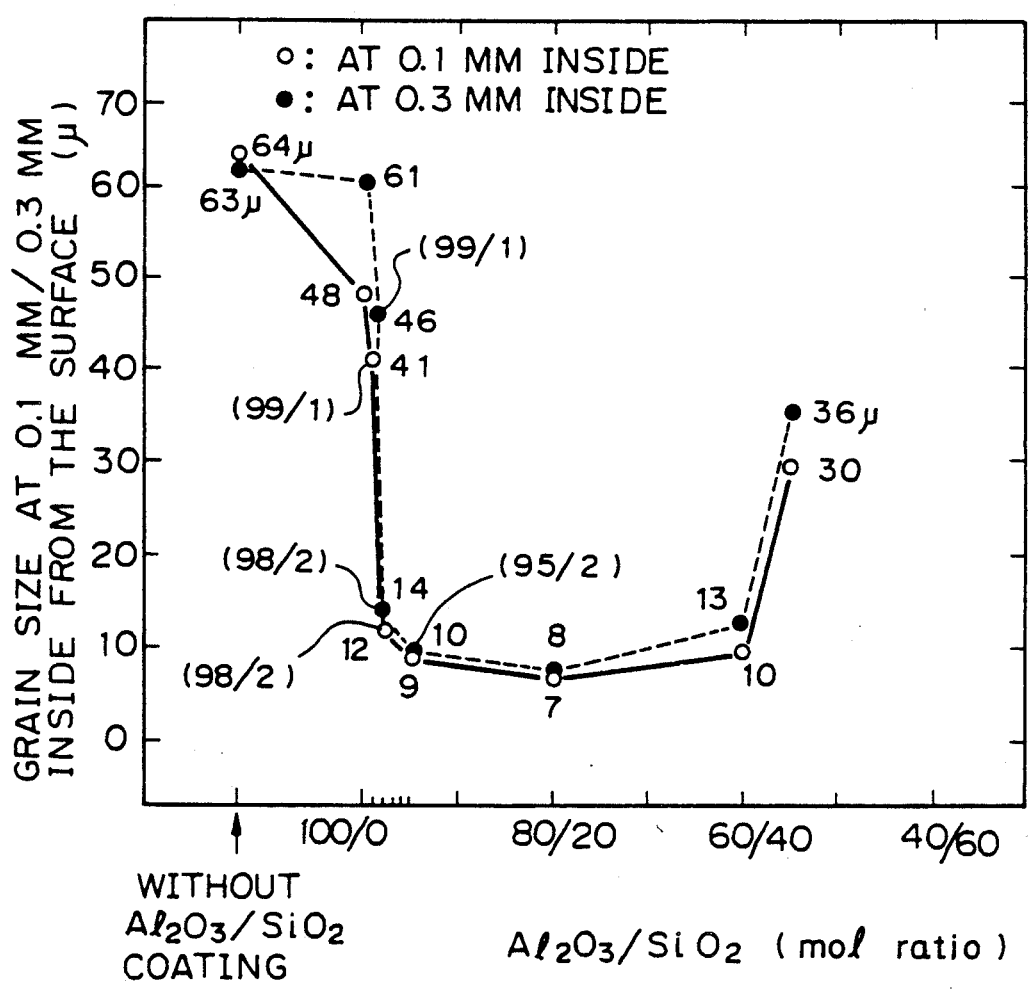
FIG. 13 and FIG. 14 are respectively graphs showing the changes in particle size internally of the porcelain and dielectric constant relative to the mixing ratio of $Al_2O_3$ to $SiO_2$.

Here, the particle sizes internally of the porcelain (here at the positions of 0.1 mm, 0.3 mm from the surface) are shown in FIG. 13, when $Al_2O_3$ alone and a mixture of $Al_2O_3$ and $SiO_2$ are respectively added with ethyl cellulose as the binder to be formed into a paste, which was coated on the whole region of the both surfaces of the molded product of $C_1$ with a thickness of 0.80 mm (by use of the composition of sample No. 4) and subjected to thermal diffusion in the firing process for semiconductor (1420° C., 4 hrs, $N_2/H_2=90/10$). The thickness of the porcelain was controlled to 0.63 mm, and the amounts of the mixture of $Al_2O_3$ and $SiO_2$ coated to 4.0-4.5 mg/cm$^2$ on front and back surfaces, respectively in each sample.

Next, a product obtained by coating the above paste on the whole region of the surface (only one surface) K of the $C_1$ molded product with a thickness of 0.50 mm, followed by firing as described above, was subjected to diffusion of $Bi_2O_3$ into the crystal grain boundary in air at 1250° C. for 30 minutes to insulate the grain boundary, and then baked with Ag electrodes of predetermined shapes, and the respective dielectric constants were measured. The results are shown in Table 14.

Figure 14:
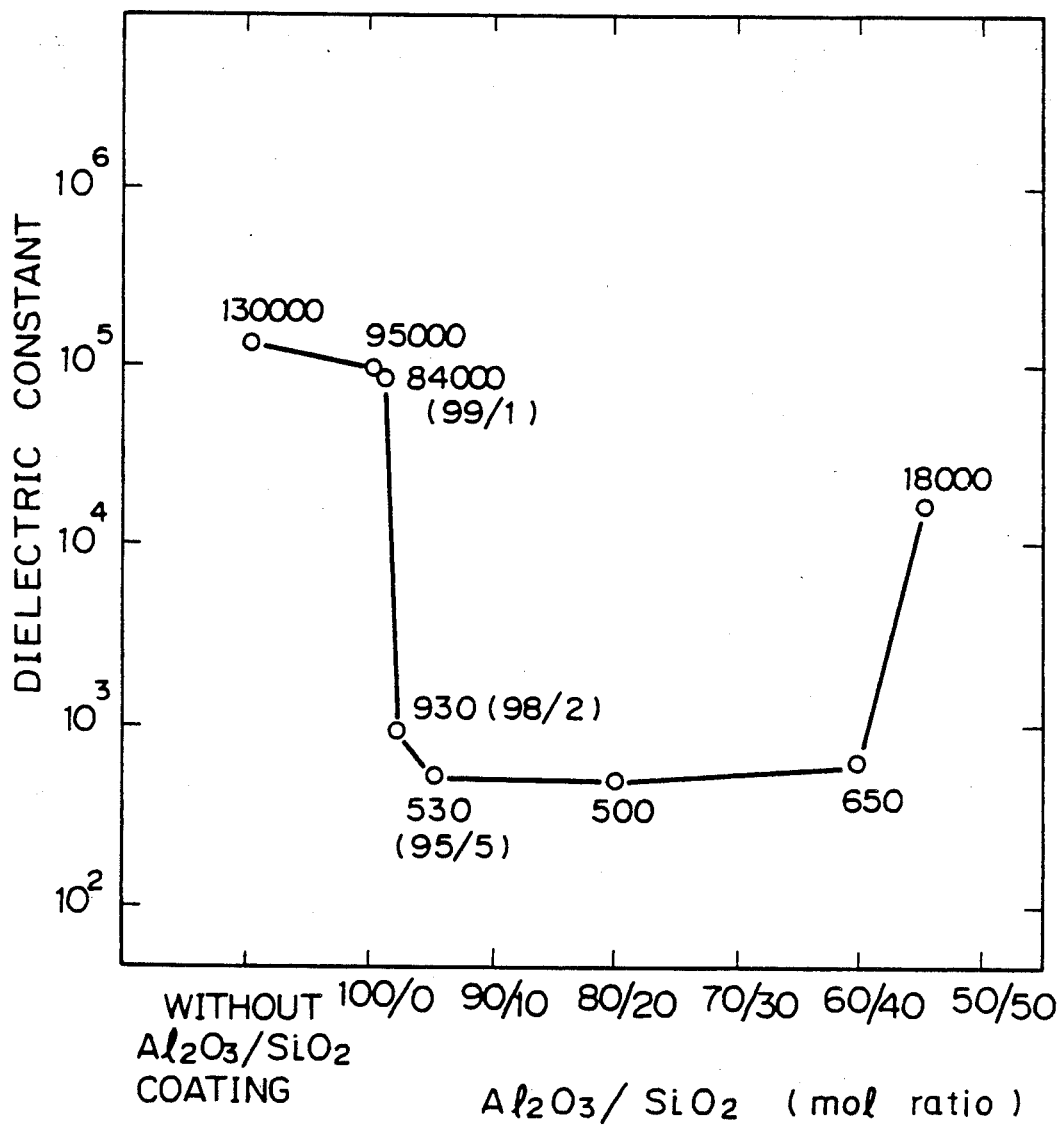

As can be seen from FIG. 13 and FIG. 14, diffusion does not proceed sufficiently with $Al_2O_3$ alone, and grain size and dielectric constant are markedly lowered with a mixture (and/or compound) comprising 60 to 98 mol % of $Al_2O_3$ and 40 to 2 mol % of $SiO_2$, whereby the promotion effect of diffusion can be recognized. Thus, $SiO_2$ is used indispensably in combination in the present invention as the component for promoting diffusion of $Al_2O_3$.

Here, the amount to be fed in forming a layer of the mixture comprising 60 to 98 mol % of $Al_2O_3$ and 40 to 2 mol % of $SiO_2$ on the surface of a molded product is to be described. In this case, the amount fed will vary depending on the thickness of the molded product and the amount fed is increased as the thickness is increased, but since the thickness of the circuit substrate employed generally frequently is at most 1.6 mm, and its relationship can be exemplified as shown in Table 4 when considered within this range.

Table 4 was obtained by use of the samples prepared similarly as the ceramics prepared to obtain the data in FIG. 13, except for the thickness and the firing conditions of the molded product.

From Table 4, it can be understood that the dielectric constant is lowered, while the flexural strength tends to be lowered, as the amount fed of $Al_2O_3$ and $SiO_2$ to the molded product is increased. Accordingly, it is critical that the amount fed should be determined at a level where the dielectric constant and the flexural strength are balanced, but at an amount of $Al_2O_3$ and $SiO_2$ fed less than 0.3 mg/cm$^2$, the dielectric constant becomes greater to the extent exceeding 20000, while if it exceeds 25 mg/cm$^2$, the flexural strength will be undesirably lowered to great extent. For the above reasons, the amount fed may be suitably 0.3 mg/cm$^2$ or more and 25 mg/cm$^2$ or less in practical application.

Figure 6A:
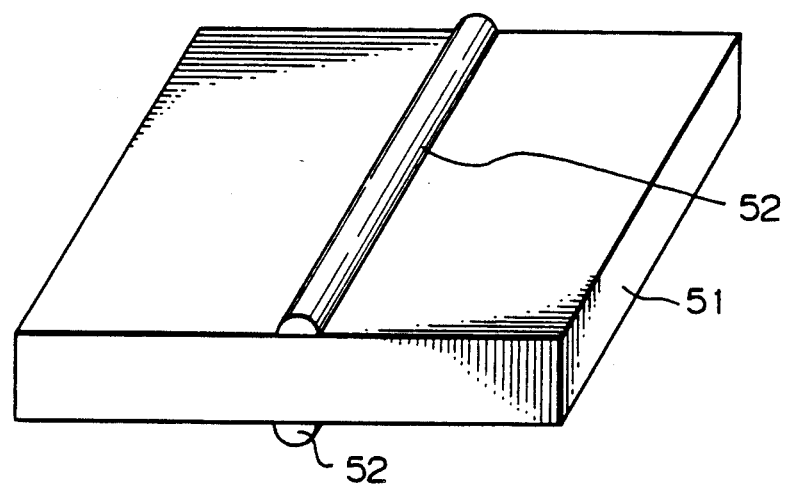
FIGS. 6A and 6B are respectively schematic perspective views of the molded product coated with a paste of e.g. alumina and the ceramic provided with electrodes.
Figure 6B:
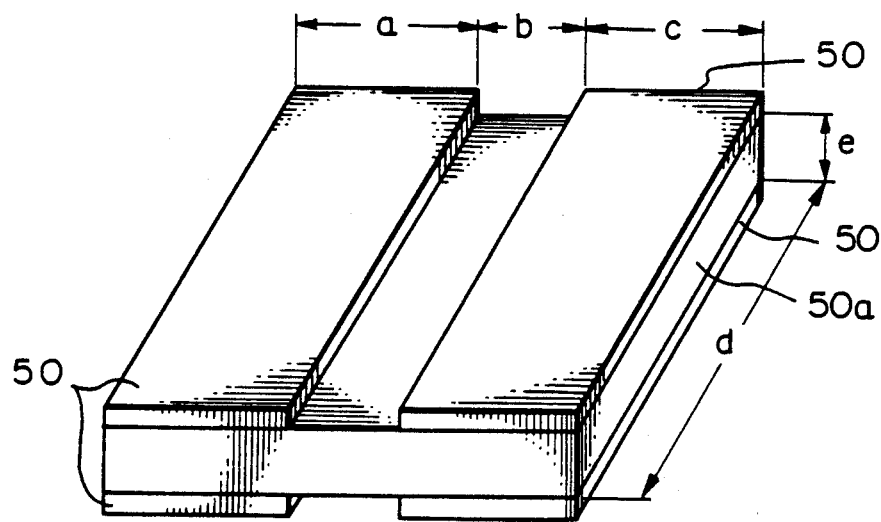

In the following, an embodiment of the steps for preparation of the ceramic shown in FIGS. 6A and 6B is described by referring to FIG. 7.

(1) The starting materials for the composition of $C_1$ are weighed, and then mixed in a wet system ball mill and dried.

(2) To the powder was added a binder of polyvinyl alcohol, etc., and the mixture was molded into a product with a predetermined shape by press molding, extrusion molding, etc.

(3) Subsequently, at the predetermined portions of the surface (preferably the both confronting front and back surfaces) of the molded product (shown by the symbol 51 in FIG. 6A), a paste comprising a powdery mixture of $Al_2O_3/SiO_2=98/2-60/40$ (mol ratio) and a binder such as ethyl cellulose, etc. (shown by the symbol 52 in FIG. 6A) is applied to a width of 0.5 mm.

(4) For removing the binder in the molded product and the coated paste, calcination is effected in air at 600° to 1200° C.

(5) The calcined product is fired in a reducing atmosphere of a gas mixture of hydrogen and nitrogen, a gas mixture of hydrogen and argon, etc. or in a neutral atmosphere of nitrogen, argon, etc. at 1320° to 1450° C. to obtain a semiconductor porcelain. Also, during this process, $Al_2O_3$ and $SiO_2$ coated are diffused into the inner portion.

(6) For insulating the crystal boundary of this semiconductor porcelain, the porcelain is soaked in a suspension comprising a weight ratio of ethyl alcohol:$Bi_2O_3$ or $Na_2O=10:1$, followed by firing in air at 1100° to 1300° C.

(7) Ag electrode (shown by the symbol 50 in FIG. 6B) was baked at the region corresponding to the necessary functional element portion.

The electrode is not limited to Ag, but Au, Al, Ni, Cu, Zn, etc. may be also available.

In FIG. 6B, products with a=3 mm, b=1, mm, c=3 mm, d=10 mm, e=0.55 mm, and e=1.6 mm (a-d are the same) were prepared.

The capacitance of the functional portion as the capacitor of the circuit substrate thus prepared and the capacitance exhibiting its separated state are shown in Table 5.

The capacitance of the functional portion as the capacitor was measured as the capacitance between the electrodes with the dielectric porcelain substrate being sandwiched in parallel in its thickness direction, and the capacitance exhibiting its separated state was shown as the cross-capacitance with the capacitance between the electrodes on the same plane.

As described above, if a layer comprising a mixture of $Al_2O_3$ and $SiO_2$ can be formed at a predetermined portion on the surface of the molded product of $C_1$ and diffused into the molded product, a region differing greatly in dielectric constant (the second region) can be formed easily in the steps.

The above molded product to be used in the present invention is generally a molded product (pressed powder or calcined product of said pressed powder, etc.) which is the precursor for forming the porcelain, but a molded product already formed into a porcelain, or a molded product by pulverizing porcelain and molding it again into pressed powder may be also used.

In the present invention, diffusion of $Al_2O_3$ and $SiO_2$ is generally performed by thermal diffusion by way of firing. Therefore, by use of a molded product which is the precursor for the above porcelain, thermal diffusion by firing and formation into porcelain can be effected at the same time as extremely advantageous in industry.

The present invention utilizes the property that the electric characteristics of the porcelain can be changed to great extent by addition of minute amounts of $Al_2O_3$ and $SiO_2$, whereby separation of the functional portions within a ceramic is rendered possible.

More specifically, by permitting $Al_2O_3$ and $SiO_2$ to exist internally of the porcelain by diffusion, etc., for example, dielectric constant will be changed remarkably. Therefore, regions with different dielectric constants can be sectionalized without changing greatly the composition of the porcelain to be built within the same ceramic.

Formation of $Al_2O_3$, $SiO_2$ layer on the porcelain surface can be performed by, for example, printing, spraying, chemical vapor deposition, evaporation, dipping, etc.

According to the ceramic of the present invention, a plurality of functional portions can be built in under the state sufficiently separated from each other.

Also, according to the circuit substrate and the electronic circuit substrate of the present invention, by being constituted of a ceramic capable of having a plurality of functional portions built therein as sectionalized under the state sufficiently separated from each other as described above, a plurality of electronic part constituent units can be built in under the state sufficiently separated mutually as the device functional portions from each other.

TABLE 3

| Sample No. | Composition of portion 121 | Composition of portion 122 | Flexural strength of bonded product |
|---|---|---|---|
| 37 | Sample No. 4 | Sample No. 4 | 1500 |
| 38 | " | Sample No. 25 | 1300 |
| 39 | " | Sample No. 26 | 1100 |
| 40 | " | Sample No. 27 | 1000 |
| 41 | " | Sample No. 28 | 1000 |
| 42 | " | Sample No. 29 | 780 |
| 43 | " | Sample No. 30 | 1200 |
| 44 | " | Sample No. 31 | 1500 |
| 45 | " | Sample No. 32 | 1700 |
| 46 | " | Sample No. 33 | 1600 |
| 47 | " | Sample No. 34 | 970 |
| 48 | " | Sample No. 35 | 1600 |
| 49 | " | Sample No. 36 | 1500 |

TABLE 1

| Sample No. | Composition of main components (mol %) | | Contents of other components (mol parts per 100 mol parts of main components) | | Additive for formation of insulating layer | $\epsilon$ | tan$\delta$ (%) | IR (M$\Omega$) | Temperature change rate of dielectric constant (%, based on 25° C.) | |
|---|---|---|---|---|---|---|---|---|---|---|
| | $TiO_2$ | SrO | $MnO_2$ | $Y_2O_3$ | | | | | $-25°$ C. | $+85°$ C. |
| 1* | 49.20 | 50.80 | 3.50 | 0.12 | $Bi_2O_3$ | 22000 | 0.9 | 7100 | 13.8 | $-12.7$ |
| 2 | 49.70 | 50.30 | 3.50 | 0.12 | ↑ | 47000 | 0.8 | 5600 | 12.1 | $-10.3$ |
| 3 | 50.20 | 49.80 | 3.50 | 0.12 | ↑ | 119000 | 0.7 | 4700 | 9.7 | $-10.0$ |
| 4 | 51.00 | 49.00 | 3.50 | 0.12 | ↑ | 132000 | 0.7 | 4300 | 8.2 | $-6.8$ |
| 5 | 53.40 | 46.60 | 3.50 | 0.12 | ↑ | 101000 | 0.8 | 3900 | 9.1 | $-7.9$ |
| 6 | 53.60 | 46.40 | 3.50 | 0.12 | ↑ | 89000 | 1.3 | 3100 | 10.2 | $-9.8$ |
| 7* | 54.20 | 45.80 | 3.50 | 0.12 | ↑ | 20000 | 2.3 | 1500 | 10.0 | $-9.5$ |
| 8* | 51.00 | 49.00 | 0.30 | 0.12 | ↑ | 31000 | 0.7 | 9600 | 14.1 | $-13.2$ |
| 9 | 51.00 | 49.00 | 0.70 | 0.12 | ↑ | 40000 | 0.7 | 8200 | 13.6 | $-13.0$ |
| 10 | 51.00 | 49.00 | 2.10 | 0.12 | ↑ | 118000 | 0.6 | 4100 | 8.1 | $-7.8$ |
| 11 | 51.00 | 49.00 | 3.00 | 0.12 | ↑ | 134000 | 0.5 | 3900 | 7.5 | $-7.3$ |
| 12 | 51.00 | 49.00 | 4.80 | 0.12 | ↑ | 111000 | 0.8 | 4200 | 8.2 | $-8.1$ |
| 13 | 51.00 | 49.00 | 5.10 | 0.12 | $Bi_2O_3$ | 92000 | 1.9 | 4300 | 8.5 | $-7.8$ |
| 14* | 51.00 | 49.00 | 5.50 | 0.12 | ↑ | 67000 | 3.2 | 4500 | 8.4 | $-8.5$ |
| 15* | 51.00 | 49.00 | 3.50 | 0.01 | ↑ | 21000 | 0.5 | 9600 | 8.0 | $-8.6$ |
| 16 | 51.00 | 49.00 | 3.50 | 0.03 | ↑ | 62000 | 0.5 | 8300 | 7.9 | $-8.2$ |
| 17 | 51.00 | 49.00 | 3.50 | 0.06 | ↑ | 106000 | 0.6 | 6700 | 7.6 | $-8.3$ |
| 18 | 51.00 | 49.00 | 3.50 | 0.20 | ↑ | 115000 | 0.8 | 3500 | 6.9 | $-7.4$ |
| 19 | 51.00 | 49.00 | 3.50 | 0.27 | ↑ | 108000 | 0.9 | 3200 | 7.8 | $-8.0$ |
| 20 | 51.00 | 49.00 | 3.50 | 0.37 | ↑ | 67000 | 1.9 | 1700 | 7.8 | $-7.5$ |
| 21* | 51.00 | 49.00 | 3.50 | 0.42 | ↑ | 48000 | 2.8 | 1100 | 7.9 | $-8.1$ |
| 22 | 51.00 | 49.00 | 2.10 | 0.12 | $Na_2O$ | 140000 | 0.6 | 3900 | 7.4 | $-6.3$ |
| 23 | 51.00 | 49.00 | 3.00 | 0.12 | ↑ | 144000 | 0.7 | 3500 | 6.8 | $-8.2$ |
| 24 | 51.00 | 49.00 | 4.80 | 0.12 | ↑ | 128000 | 0.8 | 3400 | 7.4 | $-8.1$ |

*outside the range of the present invention

TABLE 2

| Sample No. | Components of main components (mol %) | | Contents of other components (mol parts per 100 mol parts of main components) | | | | Additive for formation of insulating layer | $\epsilon$ | tan $\delta$ (%) | IR (M$\Omega$) | Average particle diameter of porcelain ($\mu$) | Volume resistivity of semiconductor-porcelain (cm) | Flexural strength (kg/cm$^2$) |
|---|---|---|---|---|---|---|---|---|---|---|---|---|---|
| | $TiO_2$ | SrO | $MnO_2$ | $Y_2O_3$ | $SiO_2$ | $Al_2O_3$ | | | | | | | |
| 4 | 51.00 | 49.00 | 3.50 | 0.12 | — | — | $Bi_2O_3$ | 132000 | 0.7 | 4300 | 64 | $3 \times 10^1$ | 1500 |
| 25 | " | " | " | " | — | 0.2 | " | 86000 | 0.7 | 4800 | 46 | $4 \times 10^2$ | 1600 |
| 26 | " | " | " | " | — | 0.5 | " | 11000 | 0.9 | 6700 | 30 | $3 \times 10^4$ | 1700 |
| 27 | " | " | " | " | — | 1.5 | " | 430 | 1.2 | 8600 | 14 | $8 \times 10^5$ | 1900 |
| 28 | " | " | " | " | — | 4.5 | " | 330 | 1.4 | 9100 | 6 | $2 \times 10^6$ | 1700 |
| 29 | " | " | " | " | — | 5.5 | " | 310 | 1.8 | 9300 | 4 | $5 \times 10^6$ | 1100 |
| 30 | " | " | " | " | 0.03 | 1.5 | " | 420 | 1.2 | 8800 | 14 | $8 \times 10^5$ | 1900 |
| 31 | " | " | " | " | 0.06 | " | " | 400 | 1.2 | 9000 | 12 | $9 \times 10^5$ | 2100 |
| 32 | " | " | " | " | 0.8 | " | " | 370 | 1.0 | 9400 | 10 | $1 \times 10^6$ | 2300 |
| 33 | " | " | " | " | 1.8 | " | " | 350 | 1.0 | 9700 | 10 | $2 \times 10^6$ | 2000 |
| 34 | " | " | " | " | 2.2 | " | " | 350 | 0.9 | 9800 | 9 | $3 \times 10^6$ | 1300 |
| 35 | " | " | " | " | 0.8 | 0.5 | " | 10000 | 0.9 | 7200 | 26 | $4 \times 10^4$ | 2200 |
| 36 | " | " | " | " | 0.8 | 4.5 | " | 310 | 1.3 | 9600 | 5 | $4 \times 10^6$ | 2100 |

TABLE 4

| Sample No. | Molding thickness (mm) | Al₂O₃/SiO₂ (mol ratio) | Amount fed to molding (mg/cm²) | Firing (diffusion) condition Temperature (°C.) | Time (Hr) | Dielectric constant | Flexural strength (Kg/cm²) |
|---|---|---|---|---|---|---|---|
| 50* | 2.0 | — | 0 | 1435 | 6 | 134000 | 1700 |
| 51* | " | 80/20 | 0.15 | " | " | 85000 | 1700 |
| 52 | " | " | 0.4 | " | " | 5100 | 1600 |
| 53 | " | " | 1.5 | " | " | 1500 | 1600 |
| 54 | " | " | 8.0 | " | " | 750 | 1400 |
| 55 | " | " | 22 | " | " | 640 | 1100 |
| 56* | " | " | 29 | " | " | 610 | 680 |
| 57* | " | 99/1 | 8.0 | " | " | 33000 | 1700 |
| 58 | " | 98/2 | 8.0 | " | " | 6700 | 1600 |
| 59 | " | 95/5 | 8.0 | " | " | 2100 | 1500 |
| 60 | " | 60/40 | 8.0 | " | " | 1600 | 1600 |
| 61* | " | 55/45 | 8.0 | " | " | 19000 | 1600 |
| 62* | 0.7 | — | 0 | 1420 | 4 | 130000 | 1700 |
| 63* | " | 80/20 | 0.15 | " | " | 21000 | 1700 |
| 64 | " | " | 0.4 | " | " | 2300 | 1600 |
| 65 | " | " | 1.5 | " | " | 670 | 1500 |
| 66 | " | " | 8.0 | " | " | 490 | 1200 |
| 67 | " | " | 22 | " | " | 480 | 960 |
| 68* | " | " | 29 | " | " | 490 | 520 |

TABLE 5

| Sample No. | Composition of functional device portion | Functional device separating portion Al₂O₃/SiO₂ (mol ratio) | Amount fed to molding (mg/cm²) | Porcelain plate thickness (mm) | Functional device portion capacitance (nF) | Separating portion cross-capacitance (pF) |
|---|---|---|---|---|---|---|
| 69* | the same as Sample No. 4 | 80/ | 0.15 | 0.55 | 62 | 3300 |
| 70 | " | " | 0.4 | " | 60 | 380 |
| 71 | " | " | 1.5 | " | 59 | 95 |
| 72 | " | " | 8.0 | " | 57 | 81 |
| 73 | " | " | 22 | " | 54 | 78 |
| 74* | " | " | 29 | " | 41 | 79 |
| 75* | " | 99/1 | 8.0 | 1.6 | 21 | 9400 |
| 76 | " | 98/2 | " | " | 20 | 960 |
| 77 | " | 95/5 | " | " | 20 | 350 |
| 78 | " | 80/20 | " | " | 17 | 140 |
| 79 | " | 60/40 | " | " | 19 | 230 |
| 80* | " | 55/45 | " | " | 18 | 5200 |

*is outside scope of the invention

What is claimed is:

1. A ceramic comprising therein at least two dielectric regions including (a) a first region having (i) a principal composition consisting of from 49.50–54.00 mole percent of TiO₂ and from 50.50–46.00 mole percent of SrO; (ii) from 0.50–5.30 moles MnO₂ per 100 moles of the principal composition and (iii) from 0.02–0.40 moles Y₂O₃ per 100 moles of said principal composition; and (b) a second region having (i) a principal composition consisting of from 49.50–54.00 mole percent of TiO₂ and from 50.50–46.00 mole percent of SrO; (ii) from 0.50–5.30 moles MnO₂ per 100 moles of the principal composition; (iii) from 0.02–0.40 moles Y₂O₃ per 100 moles of said principal composition; and (iv) from 0.40–5.00 moles Al₂O₃ and from 0.05–2.00 moles SiO₂ per 100 moles of said principal composition.

2. A ceramic according to claim 1 wherein the first region has a dielectric constant which is at least 10 times the dielectric constant of the dielectric constant of the second region.

3. The ceramic according to claim 1 further including at least one oxide for insulating the crystal grain boundary, said oxide selected from the group consisting of iron oxide, cobalt oxide, vanadium oxide, chromium oxide, lead oxide, copper oxide, bismuth oxide, and sodium oxide.

4. A circuit substrate comprising:
a ceramic comprising therein at least two dielectric regions including (a) a first region having (i) a principal composition consisting of from 49.50–54.00 mole percent of TiO₂ and from 50.50–46.00 mole percent of SrO; (ii) from 0.50–5.30 moles MnO₂ per 100 moles of the principal composition and (iii) from 0.02–0.40 moles Y₂O₃ per 100 moles of said principal composition; and (b) a second region having (i) a principal composition consisting of from 49.50–54.00 mole percent of TiO₂ and from 50.50–46.00 mole percent of SrO; (ii) from 0.50–5.30 moles MnO₂ per 100 moles of the principal composition; (iii) from 0.02–0.40 moles Y₂O₃ per 100 moles of said principal composition; and (iv) from 0.40–5.00 moles Al₂O₃ and from 0.05–2.00 moles SiO₂ per 100 moles of said principal composition and
electrodes internally of or at the surface of said ceramic.

5. The circuit substrate according to claim 4 wherein the first region has a dielectric constant which is at least 10 times the dielectric constant of the dielectric constant of the second region.

6. The circuit substrate according to claim 4 further including at least one oxide for insulating the crystal grain boundary, said oxide selected from the group consisting of iron oxide, cobalt oxide, vanadium oxide, chromium oxide, lead oxide, copper oxide, bismuth oxide, and sodium oxide.

UNITED STATES PATENT AND TRADEMARK OFFICE
CERTIFICATE OF CORRECTION

PATENT NO. : 4,992,399
DATED : February 12, 1991
INVENTOR(S) : MOTOO KUMAGAI, ET AL.

Page 1 of 2

It is certified that error appears in the above-identified patent and that said Letters Patent is hereby corrected as shown below:

COLUMN 1

Line 20, "as" should read --is--.

COLUMN 2

Line 2, "0.002" should read --0.02--.
Line 7, "parts $Al_2O_3$" should read --parts of $Al_2O_3$--.
Line 12, "20 mol %" should read --2 mol%--.
Line 13, "0.05" should read --0.50--.
Line 36, "0.05" should read --0.50--.
Line 51, "of in" should read --of--.

COLUMN 5

Line 14, "14000" should read --140000--.
Line 52, "$TiO_2SrO$," should read --$TiO_2$ and SrO,--.

COLUMN 7

Line 11, "existed" should be deleted.
Line 61, "porcelaim." should read --porcelain.--.

COLUMN 8

Line 3, "(TiO" should read --($TiO_2$-- and "SnO" should read --SrO--.

UNITED STATES PATENT AND TRADEMARK OFFICE
CERTIFICATE OF CORRECTION

PATENT NO. : 4,992,399
DATED : February 12, 1991
INVENTOR(S) : MOTOO KUMAGAI, ET AL.

Page 2 of 2

It is certified that error appears in the above-identified patent and that said Letters Patent is hereby corrected as shown below:

COLUMN 13

Line 45, "composition" should read --composition;--.

COLUMN 14

Line 44, "composition" should read --composition;--.
Line 55, "composition" should read --composition;--.

Signed and Sealed this

Second Day of March, 1993

Attest:

STEPHEN G. KUNIN

*Attesting Officer*

*Acting Commissioner of Patents and Trademarks*